(12) United States Patent
Sakai

(10) Patent No.: US 7,611,970 B2
(45) Date of Patent: Nov. 3, 2009

(54) WAFER PROCESSING METHOD

(75) Inventor: Toshiyuki Sakai, Tokyo (JP)

(73) Assignee: Disco Corporation, Tokyo (JP)

( * ) Notice: Subject to any disclaimer, the term of this patent is extended or adjusted under 35 U.S.C. 154(b) by 27 days.

(21) Appl. No.: 11/907,939

(22) Filed: Oct. 18, 2007

(65) Prior Publication Data

US 2008/0096368 A1 Apr. 24, 2008

(30) Foreign Application Priority Data

Oct. 23, 2006 (JP) .............................. 2006-287897

(51) Int. Cl.
*H01L 21/322* (2006.01)

(52) U.S. Cl. ...................... 438/473; 438/474; 438/799; 257/E21.317; 257/E21.318

(58) Field of Classification Search .................. 438/473, 438/471, 474, 940, 799, 690, 463, 462; 257/E21.317, 257/E21.318, E21.475
See application file for complete search history.

(56) References Cited

U.S. PATENT DOCUMENTS 6,444,589 B1 9/2002 Yoneya et al.

2002/0164842 A1* 11/2002 Nakajima .................... 438/149
2002/0173244 A1 11/2002 Sekiya et al.
2005/0214973 A1* 9/2005 Oyu et al. .................... 438/106
2006/0022321 A1 2/2006 Matsukawa et al.
2007/0141752 A1* 6/2007 Abe et al. .................... 438/113

FOREIGN PATENT DOCUMENTS

| JP | 2001-85385 | 3/2001 |
| JP | 2002-283211 | 10/2002 |
| JP | 2006-41258 | 2/2006 |

* cited by examiner

*Primary Examiner*—Caridad M Everhart
(74) *Attorney, Agent, or Firm*—Smith, Gambrell & Russell, LLP

(57) ABSTRACT

A wafer processing method for providing a gettering sink effect to a wafer having a plurality of streets which are formed in a lattice pattern on the front surface of a substrate and devices which are formed in a plurality of areas sectioned by the plurality of streets, comprising the steps of removing distortion produced on the rear surface of the substrate of the wafer whose rear surface of the substrate has been ground to a predetermined thickness; forming a gettering sink effect layer by applying a laser beam of a wavelength having permeability for the substrate of the wafer which has undergone the distortion removing step, with its focal point set to the inside of the substrate to form a deteriorated layer in the inside of the substrate; and dividing the wafer which has undergone the gettering sink effect layer forming step, into individual chips along the streets.

2 Claims, 9 Drawing Sheets

WAFER PROCESSING METHOD

FIELD OF THE INVENTION

The present invention relates to a wafer processing method for providing a gettering sink effect to a wafer such as a semiconductor wafer having a plurality of devices on the front surface.

DESCRIPTION OF THE PRIOR ART

In the production process of a semiconductor device, a large number of rectangular areas are sectioned by cutting lines called "streets" arranged in a lattice pattern on the front surface of a substantially disk-like semiconductor wafer, and a device such as IC or LSI is formed in each of the rectangular areas. Individual semiconductor chips are manufactured by cutting this semiconductor wafer having a large number of devices along the streets. To reduce the size and weight of each semiconductor chip, the rear surface of the semiconductor wafer is generally ground to a predetermined thickness before it is cut into the individual rectangular areas along the streets.

The rear surface of the semiconductor wafer is generally ground by pressing grinding stones formed by bonding diamond abrasive grains with a suitable bond such as a resin bond against the rear surface of the semiconductor wafer while it is rotated at a high speed. When the rear surface of the semiconductor wafer is ground by this grinding method, a grinding distortion layer composed of about 1 µm microcracks is formed on the rear surface of the semiconductor wafer. It is known that this grinding distortion layer has the function of providing a gettering sink effect for suppressing the bad influence upon memory function of a metal atom such as copper, which is contained in the semiconductor wafer in the production process of the semiconductor wafer and moves freely in proximity to a device, as disclosed, for example, by JP-A 2006-41258 A.

Meanwhile, especially when the thickness of the semiconductor wafer is reduced to 100 µm or less by grinding, the grinding distortion layer formed by grinding the rear surface of the above semiconductor wafer greatly reduces the deflective strength of the semiconductor chips. To remove the grinding distortion layer formed on the ground rear surface of the semiconductor wafer, as disclosed, for example, by JP-A 2002-283211 and JP-A 2001-85385, the ground rear surface of the semiconductor wafer is polished, or wet etched or dry etched.

When the grinding distortion layer formed by grinding is removed by polishing or etching after the rear surface of the wafer is ground, a problem arises in that the deflective strength of each chip becomes stable but the gettering sink effect of the grinding distortion layer is lost and the function of each device is lowered.

SUMMARY OF THE INVENTION

It is an object of the present invention to provide a wafer processing method capable of retaining a gettering sink effect and ensuring deflective strength.

To attain the above object, according to the present invention, there is provided a water processing method for providing a gettering sink effect to a wafer having a plurality of streets which are formed in a lattice pattern on the front surface of a substrate and devices which are formed in a plurality of areas sectioned by the plurality of streets, comprising:

a grinding distortion layer removing step for removing grinding distortion produced on the rear surface of the substrate of the wafer whose rear surface has been ground to a predetermined thickness;

a gettering sink effect layer forming step for forming a gettering sink effect layer by applying a laser beam of a wavelength having permeability for the substrate of the wafer which has undergone the grinding distortion layer removing step, with its focal point set to the inside of the substrate to form a deteriorated layer in the inside of the substrate; and a dividing step for dividing the wafer which has undergone the gettering sink effect layer forming step, into individual chips along the streets.

According to the present invention, there is also provided a water processing method for providing a gettering sink effect to a wafer having a plurality of streets which are formed in a lattice pattern on the front surface of a substrate and devices which are formed in a plurality of areas sectioned by the plurality of streets, comprising:

a grinding distortion layer removing step for removing grinding distortion produced on the rear surface of the substrate of the wafer whose rear surface has been ground to a predetermined thickness;

a dividing step for dividing the wafer which has undergone the grinding distortion layer removing step, into individual chips along the streets; and a gettering sink effect layer forming step for forming a gettering sink effect layer by applying a laser beam of a wavelength having permeability for the substrate of the wafer which has been divided into individual chips by the dividing step, with its focal point set to the inside of the substrate of each chip to form a deteriorated layer in the inside of the substrate.

According to the present invention, since the grinding distortion layer formed by grinding is removed from the rear surface of the substrate by carrying out the grinding distortion layer removing step, deflective strength becomes stable. Further, since a deteriorated layer is formed in the intermediate portion in the thickness direction of the substrate of each chip by carrying out the gettering sink effect layer forming step, this deteriorated layer functions as a gettering sink effect layer.

DETAILED DESCRIPTION OF THE PREFERRED EMBODIMENTS

Preferred embodiments of the present invention will be described in more detail hereinunder with reference to the accompanying drawings.

Figure 1:
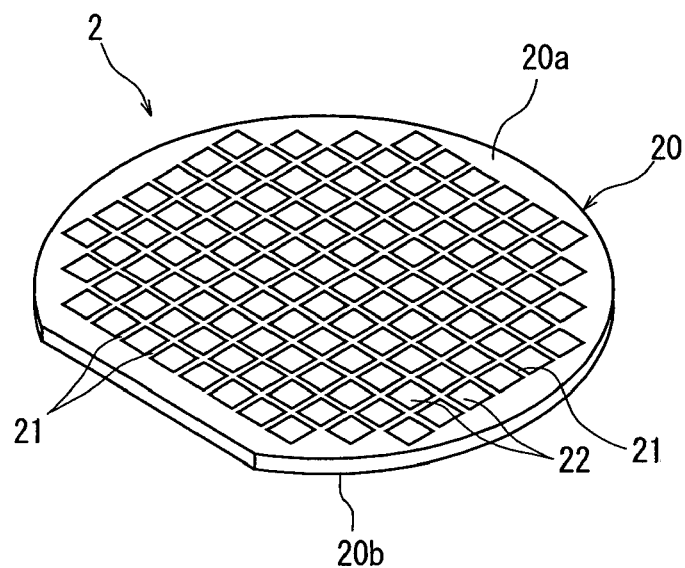
FIG. 1 is a perspective view of a semiconductor wafer to be processed by the wafer processing method of the present invention.
Figure 2:
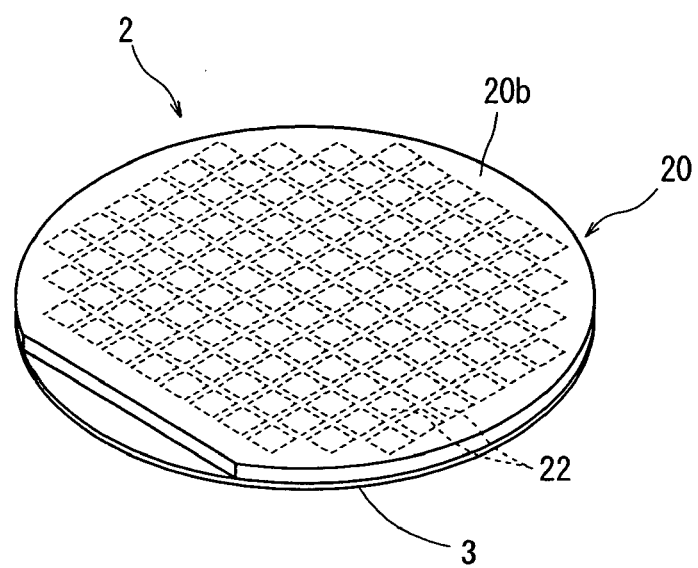
FIG. 2 is a perspective view showing a state where a protective member is affixed onto the front surface of the semiconductor wafer shown in FIG. 1.

FIG. 1 is a perspective view of a semiconductor wafer as a wafer to be processed according to the present invention. In the semiconductor wafer 2 shown in FIG. 1, a plurality of streets 21 are formed in a lattice pattern on the front surface 20a of a substrate 20 made of silicon and a device 22 is formed in a plurality of areas sectioned by the plurality of streets 21. A protective member 3 is affixed to the front surface 20a of the substrate 20 of the semiconductor wafer 2 constituted as described above, as shown in FIG. 2 (protective member affixing step).

Figure 3:
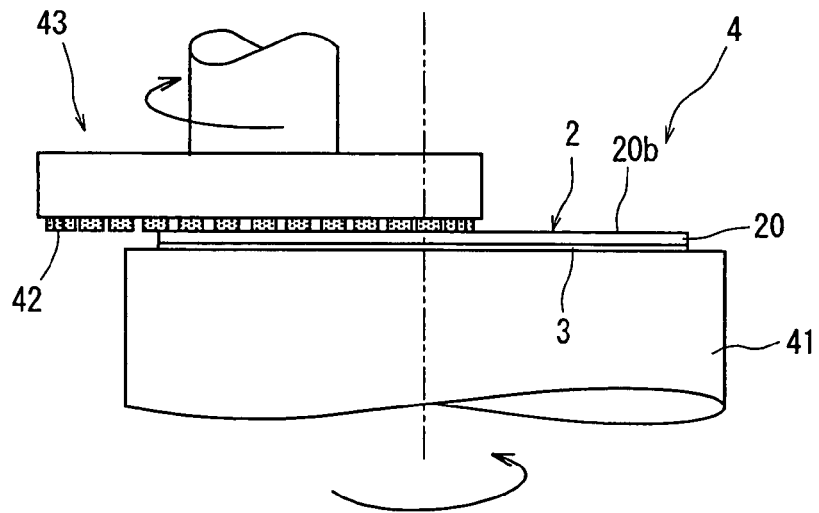
FIG. 3 is an explanatory diagram showing the grinding step in the wafer processing method of the present invention.

After the protective member 3 is affixed to the front surface 20a of the substrate 20 of the semiconductor wafer 2 by carrying out the protective member affixing step, next comes the step of grinding the rear surface 20b of the substrate 20 of the semiconductor wafer 2 to a predetermined thickness. This grinding step is carried out by using a grinding machine 4 shown in FIG. 3. The grinding machine 4 shown in FIG. 3 comprises a chuck table 41 for holding a workpiece and a grinding wheel 43 having grinding stones 42 for grinding the workpiece held on the chuck table 41. To carry out the above grinding step by using the above grinding machine 4, the protective member 3 side of the semiconductor wafer 2 is placed on the chuck table 41 (therefore, the rear surface 20b of the substrate 20 of the semiconductor wafer 2 faces up), and the semiconductor wafer 2 is suction-held on the chuck table 41 by a suction means that is not shown. The grinding wheel 43 having grinding stones 42 is rotated at 6,000 rpm and brought into contact with the rear surface 20b of the substrate 20 while the chuck table 41 is rotated at, for example, 300 rpm to grind the rear surface to a predetermined thickness, for example, 100 μm. When this grinding step is carried out as described above, a grinding distortion layer having a thickness of about 1 μm is formed on the rear surface 20b of the substrate 20 of the semiconductor wafer 2 by the above grinding.

Figure 4:
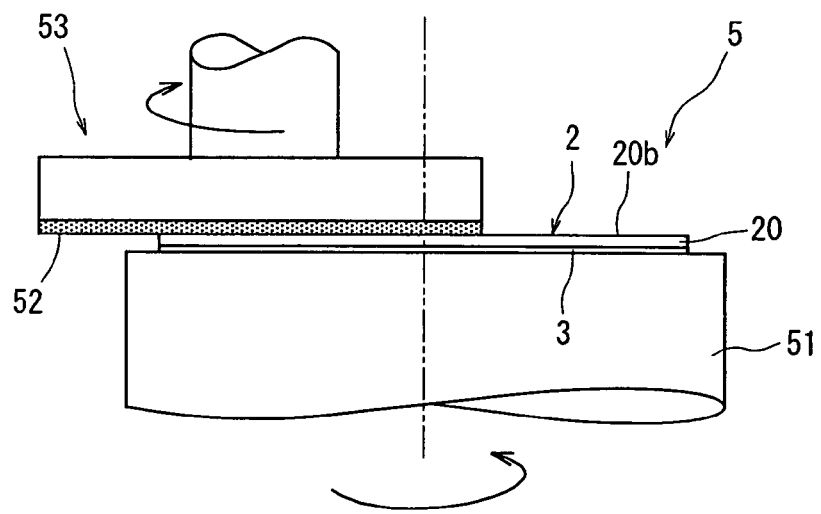
FIG. 4 is an explanatory diagram showing the grinding distortion layer removing step in the wafer processing method of the present invention.

The above grinding step is followed by the step of removing the grinding distortion layer formed on the rear surface 20b of the substrate 20 of the semiconductor wafer 2. This grinding distortion layer removing step is carried out by using a polishing machine 5 shown in FIG. 4. The polishing machine 5 shown in FIG. 4 comprises a chuck table 51 for holding a workpiece and a polishing tool 53 for polishing the workpiece held on the chuck table 51, which has a polishing stone 52 manufactured by dispersing zirconia oxide abrasive grains into a soft member such as felt and fixing them with a suitable bonding agent. To carry out the above grinding distortion layer removing step by using this polishing machine 5, the protective member 3 side of the semiconductor wafer 2 which has undergone the above grinding step is placed on the chuck table 51 (therefore, the rear surface 20b of the substrate 20 of the semiconductor wafer 2 faces up), and the semiconductor wafer 2 is suction-held on the chuck table 51 by the suction means that is not shown. The polishing tool 53 having a polishing stone 52 is rotated at, for example, 6,000 rpm and brought into contact with the rear surface 20b of the substrate 20 while the chuck table 51 is rotated at, for example, 300 rpm to polish the rear surface 20b of the substrate 20. As a result, the grinding distortion layer formed on the rear surface 20b of the substrate 20 of the semiconductor wafer 2 is removed by carrying out the above polishing step. The grinding distortion layer removing step may be carried out by polishing or wet etching, dry etching and others.

The grinding distortion layer removing step is followed by the step of forming a gettering sink effect layer by applying a laser beam of a wavelength having permeability for the substrate 20 of the semiconductor wafer 2 from which the grinding distortion layer has been removed, with its focal point set to the inside of the substrate 20 to form a deteriorated layer in the substrate 20. The gettering sink effect layer forming step is carried out by using a laser beam processing machine 6 shown in FIG. 5. The laser beam processing machine 6 shown in FIG. 5 comprises a chuck table 61 for holding a workpiece and a laser beam application means 62 for applying a laser beam to the workpiece held on the chuck table 61. The chuck table 61 is designed to suction-hold the workpiece and to be moved in a processing-feed direction indicated by an arrow X in FIG. 5 by a processing-feed mechanism that is not shown and an indexing-feed direction indicated by an arrow Y by an indexing-feed mechanism that is not shown. The above laser beam application means 62 applies a pulse laser beam from a condenser 622 mounted on the end of a cylindrical casing 621 arranged substantially horizontally. The illustrated laser beam processing machine 6 has an image pick-up means 63 attached to the end portion of the casing 621 constituting the above laser beam application means 62. This image pick-up means 63 is constituted by an infrared illuminating means for applying infrared radiation to the workpiece, an optical system for capturing the infrared radiation applied by the infrared illuminating means and an image pick-up device (infrared CCD) for outputting an electric signal corresponding to the infrared radiation captured by the optical system in addition to an ordinary image pick-up device (CCD) for picking up an image with visible radiation. An image signal is supplied to a control means that is not shown.

Figure 5:
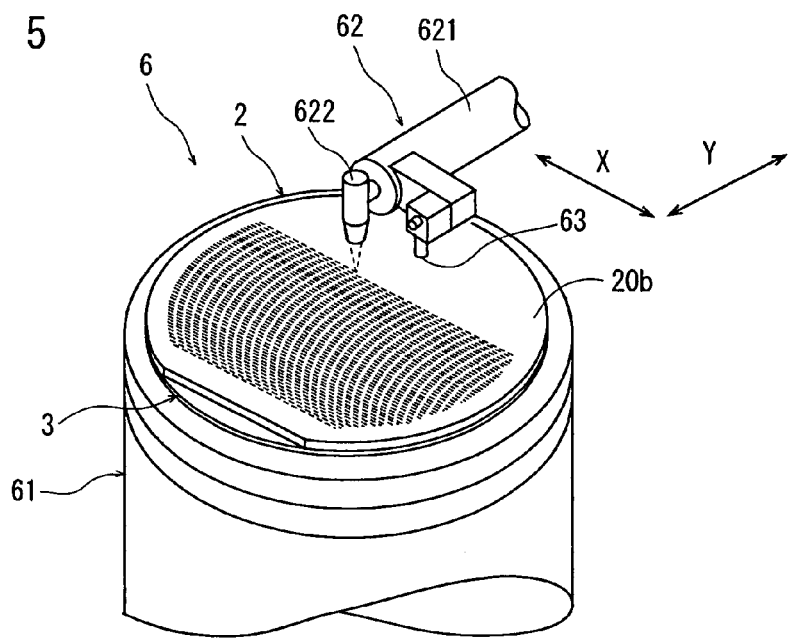
FIG. 5 is a perspective view of the principal portion of a laser beam processing machine for carrying out the gettering sink effect layer forming step in the wafer processing method of the present invention.

To carry out the gettering sink effect layer forming step by using the above laser beam processing machine 6 shown in FIG. 5, the protective member 3 side of the semiconductor wafer 2 which has undergone the above polishing step is first placed on the chuck table 61 (therefore, the rear surface 20b of the substrate 20 of the semiconductor wafer 2 faces up), and the semiconductor wafer 2 is suction-held on the chuck table 61 by the suction means that is not shown. The chuck table 61 suction-holding the semiconductor wafer 2 is brought to a position right below the image pick-up means 63 by a moving mechanism that is not shown.

After the chuck table 61 is positioned right below the image pick-up means 63, alignment work for detecting the area to be processed of the semiconductor wafer 2 is carried out by the image pick-up means 63 and the control means that is not shown. That is, the image pick-up means 63 and the control means (not shown) detect the area where the plurality of devices 22 are formed on the front surface 20a of the substrate 20 of the semiconductor wafer 2 to obtain the XY coordinate values of the area to be processed. Although the front surface 20a, on which the device 22 is formed, of the substrate 20 of the semiconductor wafer 2 faces down at this point, as the image pick-up means 63 comprises an infrared illuminating means, an optical system for capturing infrared radiation and an image pick-up device (infrared CCD) for outputting an electric signal corresponding to the infrared radiation as described above, it can pick up an image of the devices 22 through the rear surface 20b.

Figure 6:
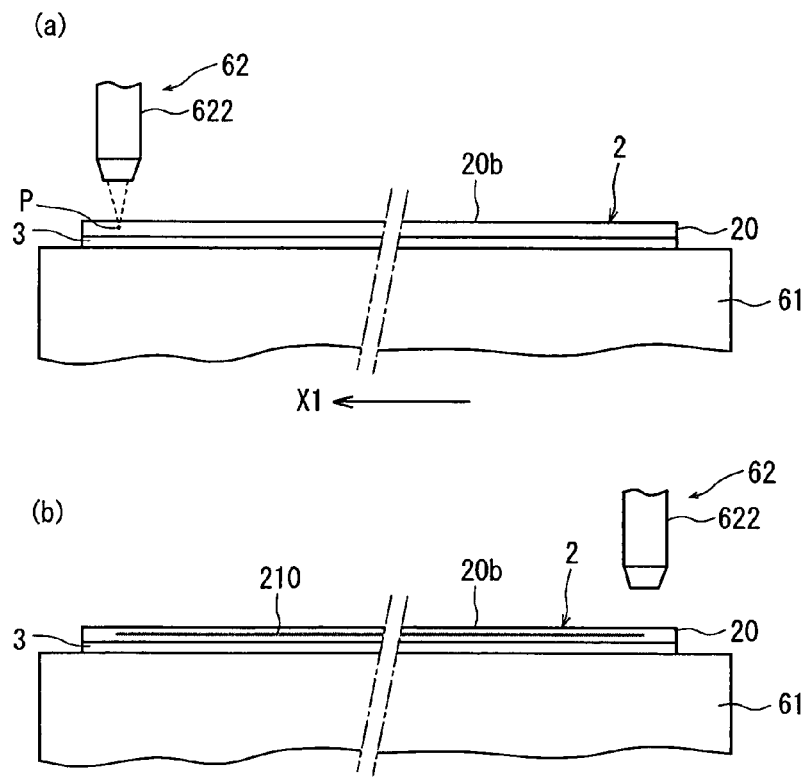
FIGS. 6(a) and 6(b) are explanatory diagrams showing the gettering sink effect layer forming step in the wafer processing method of the present invention.

The chuck table 61 is then moved to a laser beam application area where the condenser 622 of the laser beam application means 62 for applying a laser beam is located, to bring the processing start position to a position right below the condenser 622 of the laser beam application means 62, as shown in FIG. 6(a). The chuck table 61 is then moved at a predetermined speed in a direction indicated by an arrow X1 in FIG. 6(a) while a pulse laser beam of a wavelength having permeability for the substrate 20 is applied from the condenser 622 (gettering sink effect layer forming step). When the application position of the condenser 622 of the laser beam application means 62 reaches the right end in FIG. 6(b) of the area where the devices are formed as shown in FIG. 6(b), the application of a pulse laser beam is suspended and the movement of the chuck table 61 is stopped. In this gettering sink effect layer forming step, a deteriorated layer 210 is formed in an intermediate portion in the thickness direction of the semiconductor wafer 2 by setting the focal point P of the pulse laser beam to the intermediate portion in the thickness direction of the semiconductor wafer 2.

The processing conditions in the above gettering sink effect layer forming step are set as follows, for example.

Light source: LD excited Q switch Nd:YVO4 pulse laser
Wavelength: pulse laser beam having a wavelength of 1,064 nm
Repetition frequency: 100 kHz
Peak power density of focal point: $1\times10^8$ W/cm$^2$
Focal spot diameter: 1 μm
Processing-feed rate: 100 mm/sec A deteriorated layer 210 having a thickness of 1 to 2 μm is formed in the inside of the substrate 20 of the semiconductor wafer 2 by carrying out the gettering sink effect layer forming step under the above processing conditions. The above gettering sink effect layer forming step is carried out on all the areas corresponding to the plurality of devices formed on the front surface 20a of the substrate 20 of the semiconductor wafer 2. The interval between the deteriorated layers 210 should be about 1 μm. The deteriorated layers 210 formed in the inside of the substrate 20 serve as gettering sink effect layers.

Figure 7:
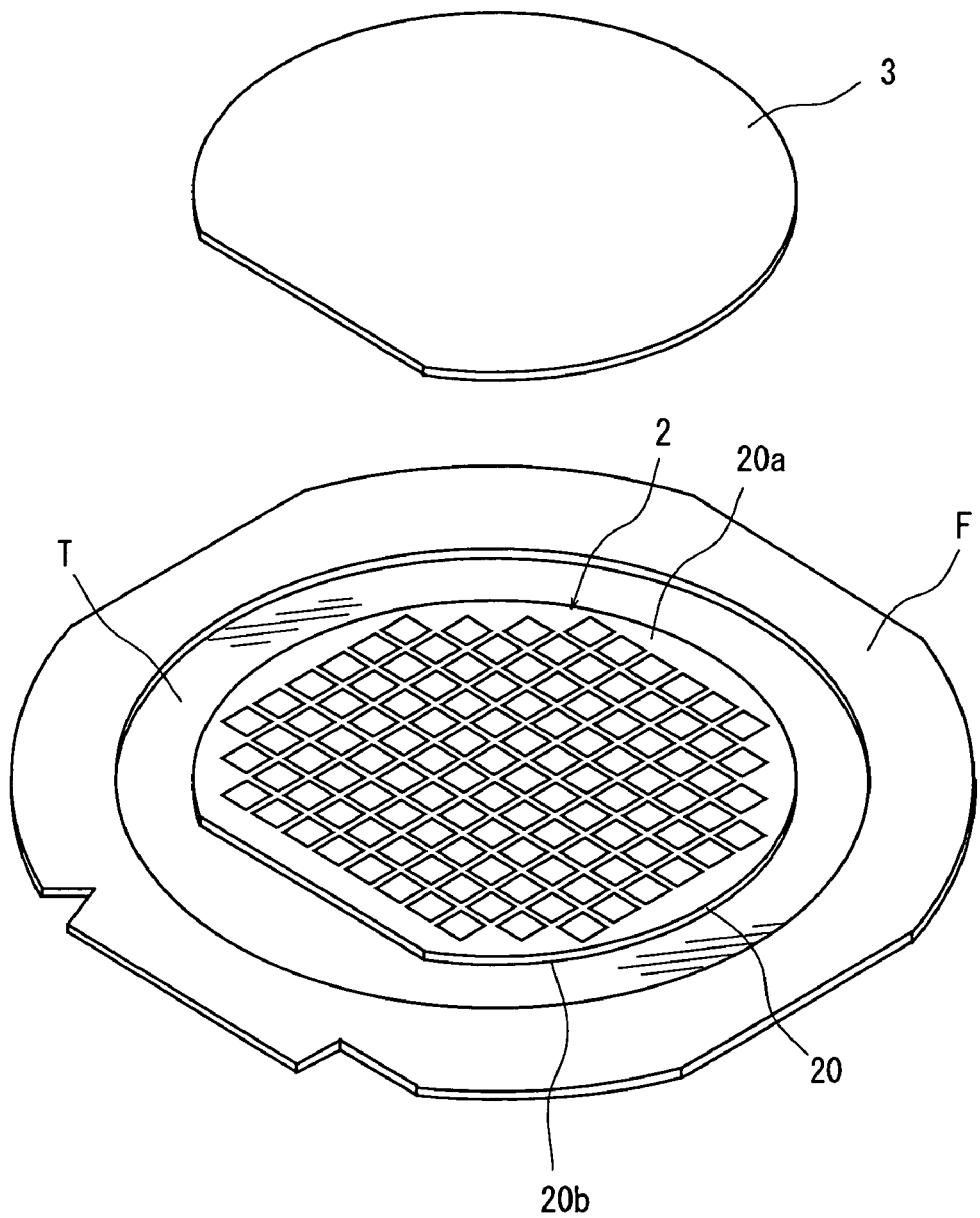
FIG. 7 is an explanatory diagram showing the wafer supporting step in the wafer processing method of the present invention.

After the gettering sink effect layer forming step is carried out as described above, the rear surface 20b of the substrate 20 of the semiconductor wafer 2 is put on the front surface of a dicing tape T mounted on an annular frame F, as shown in FIG. 7 (wafer supporting step). Then, the protective member 3 is removed from the front surface 20a of the substrate 20 of the semiconductor wafer 2.

After the wafer supporting step, next comes the step of dividing the semiconductor wafer 2, which has undergone the gettering sink effect layer forming step, into individual chips along the streets 21. This dividing step is carried out by using a cutting machine 7 shown in FIG. 8. The cutting machine 7 shown in FIG. 8 comprises a chuck table 71 for holding a workpiece, a cutting means 72 having a cutting blade 721 for cutting the workpiece held on the chuck table 71 and an image pick-up means 73 for picking up an image of the workpiece held on the chuck table 71. The chuck table 71 is designed to suction-hold the workpiece and to be moved in a processing-feed direction indicated by an arrow X and an indexing-feed direction indicated by an arrow Y in FIG. 8, by a moving mechanism that is not shown. The cutting blade 721 comprises a disk-like base and an annular cutting edge which is mounted on the side surface outer periphery of the base and formed by fixing diamond abrasive grains having a diameter of about 3 μm to the base by electroforming. The above image pick-up means 73 comprises an ordinary image pick-up device (CCD) for picking up an image with visible radiation and supplies an image signal to the control means (not shown) in the illustrated embodiment.

Figure 8:
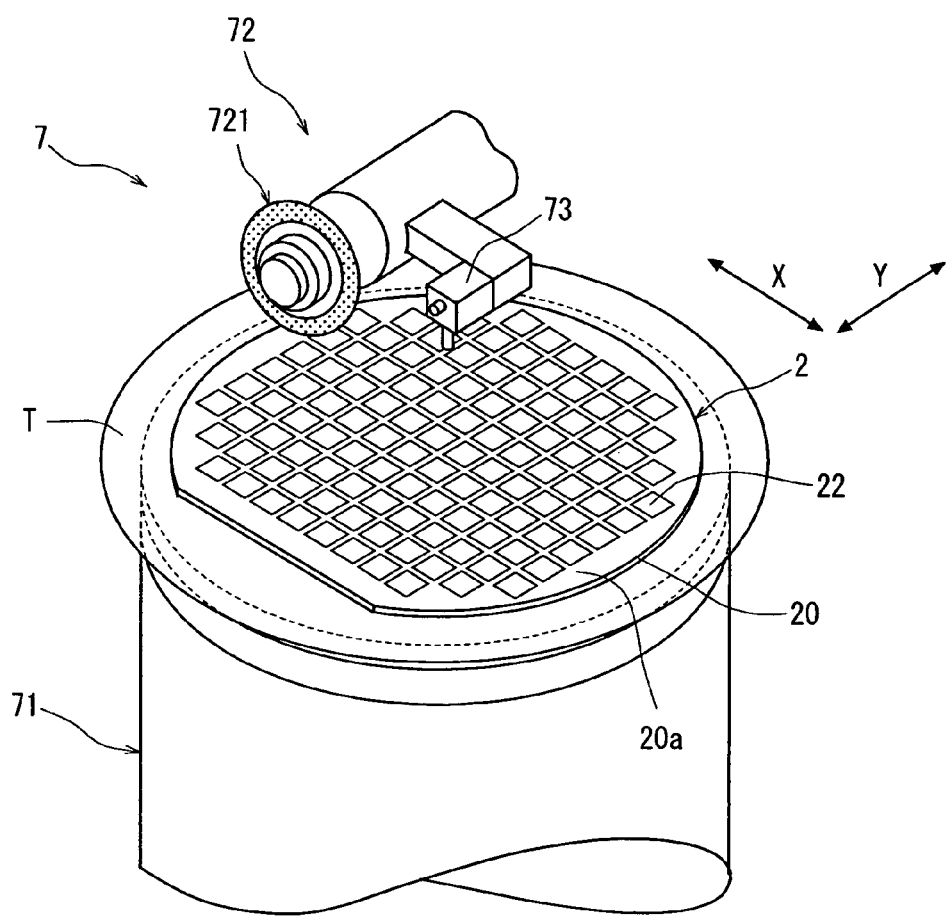
FIG. 8 is a perspective view of the principal portion of a cutting machine for carrying out the dividing step in the wafer processing method of the present invention.

To carry out the dividing step by using the cutting machine 7 constituted as described above, the dicing tape T affixed to the semiconductor wafer 2 in the above wafer supporting step is placed on the chuck table 71. By activating the suction means (not shown), the semiconductor wafer 2 is held on the chuck table 71 through the dicing tape T. In FIG. 8, the annular frame F holding the dicing tape T is not shown but the annular frame F is held by a suitable frame holding means provided on the chuck table 71. The chuck table 71 suction-holding the semiconductor wafer 2 is brought to a position right below the image pick-up means 73 by the cutting-feed mechanism that is not shown.

After the chuck table 71 is positioned right below the image pick-up means 73, the alignment step for detecting the area to be cut of the semiconductor wafer 2 is carried out by the image pick-up means 73 and the control means that is not shown. That is, the image pick-up means 73 and the control means (not shown) carry out image processing such as pattern matching, etc. to align a street 21 formed in a predetermined direction of the semiconductor wafer 2 with the cutting blade 721, thereby performing the alignment of the area to be cut (aligning step). The alignment of the area to be cut is also carried out on streets 21 formed on the semiconductor wafer 2 in a direction perpendicular to the above predetermined direction.

Figure 9:
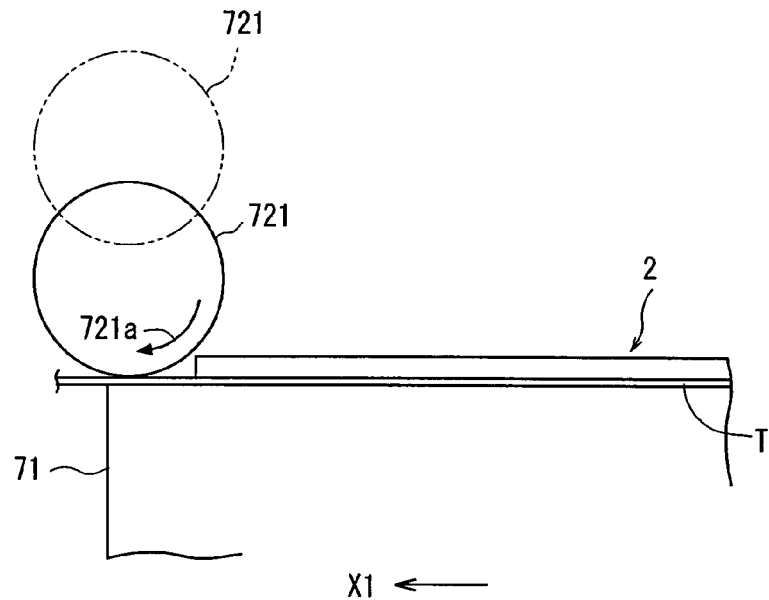
FIG. 9 is an explanatory diagram showing the dividing step in the wafer processing method of the present invention.

After the alignment of the area to be cut is carried out by detecting the street 21 formed on the semiconductor wafer 2 held on the chuck table 71 as described above, the chuck table 71 holding the semiconductor wafer 2 is moved to the cutting start position of the area to be cut. At this point, the semiconductor wafer 2 is positioned such that one end (left end in FIG. 9) of the street 21 to be cut is located on the right side a predetermined distance from a position right below the cutting blade 721, as shown in FIG. 9. The cutting blade 721 is then rotated at a predetermined speed in a direction indicated by an arrow 721a in FIG. 9 and moved down (cutting-in fed) until the lower end of the cutting blade 721 reaches the dicing tape T, as shown by a solid line in FIG. 9, from a stand-by position shown by a long dashed double-short dashed line by a cutting-in feed mechanism.

After the cutting blade 721 is moved down as described above, the chuck table 71 is moved in the direction indicated by the arrow X1 in FIG. 9 at a predetermined cutting-feed rate while the cutting blade 721 is rotated at the predetermined revolution in the direction indicated by the arrow 721a in FIG. 9. When the right end of the semiconductor wafer 2 held on the chuck table 71 passes a position right below the cutting blade 721, the movement of the chuck table 71 is stopped. As a result, the semiconductor wafer 2 is cut along the street 21.

The above dividing step is carried out under the following processing conditions, for example.

Figure 10:
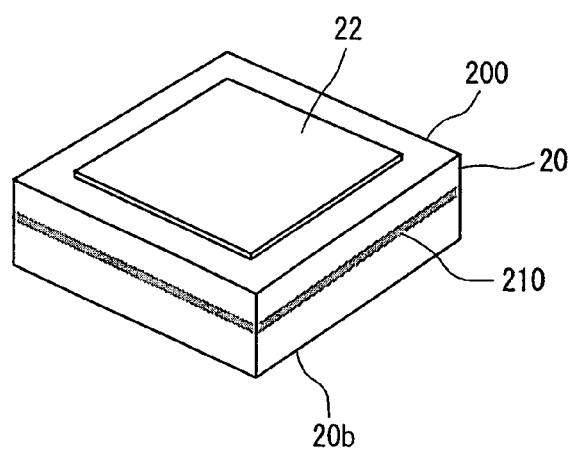
FIG. 10 is a perspective view of a semiconductor chip obtained by dividing the semiconductor wafer by the dividing step shown in FIG. 9.

Cutting blade: outer diameter of 52 mm, thickness of 30 μm
Revolution of cutting blade: 40,000 rpm
Cutting-feed rate: 50 mm/sec The above cutting step is carried out on all the streets 21 formed on the semiconductor wafer 2. As a result, the semiconductor wafer 2 is cut along the streets 21 and divided into semiconductor chips 200 corresponding to the devices 22 as shown in FIG. 10 (dividing step). Since the grinding distortion layer formed in the grinding step is removed from the rear surface 20b of the substrate 20 of each semiconductor chip 200 by carrying out the above grinding distortion layer removing step, the deflective strength becomes stable. Further, since the deteriorated layer 210 is formed in the intermediate portion in the thickness direction of the substrate 20 of each semiconductor chip 200 by carrying out the above gettering sink effect layer forming step, the deteriorated layer 210 serves as a gettering sink effect layer.

A description is subsequently given of another embodiment of the wafer processing method of the present invention.

Figure 11:
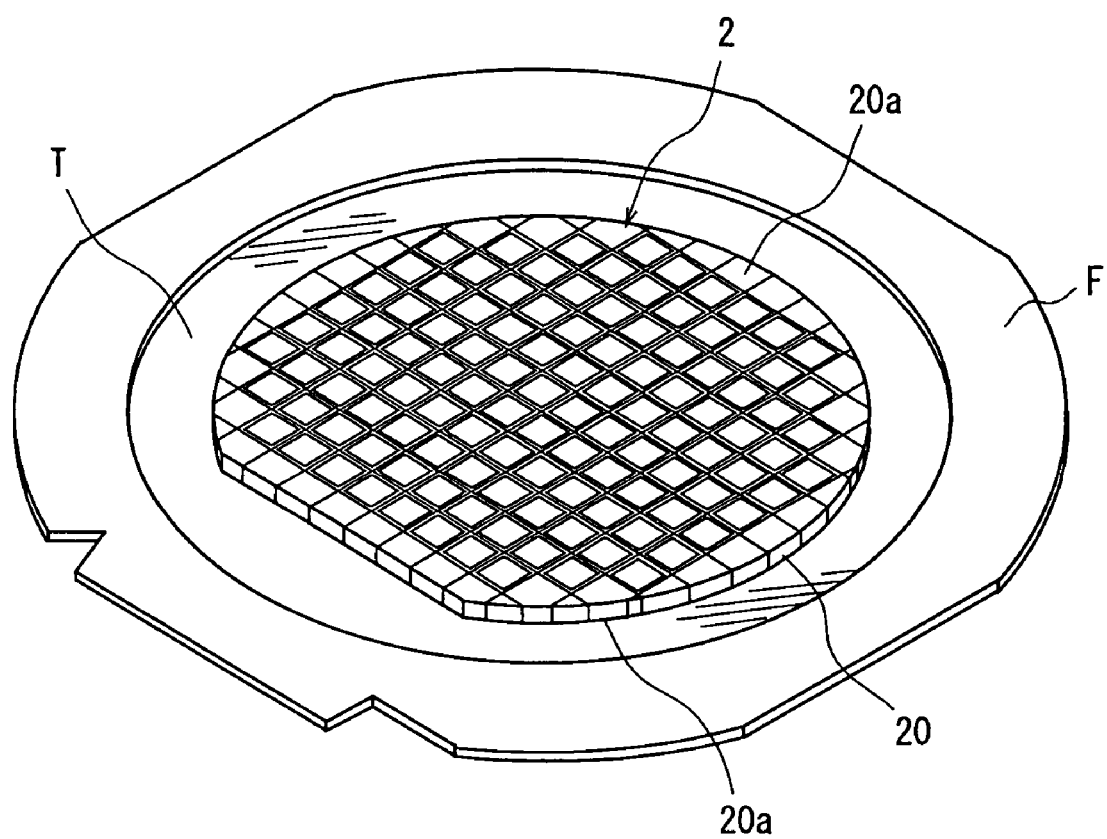
FIG. 11 is a perspective view of the semiconductor wafer divided into individual semiconductor chips whose front surface side is put on the front surface of a dicing tape mounted on an annular frame.

In this embodiment, the semiconductor wafer 2 is first divided into individual semiconductor chips by carrying out the above grinding step, grinding distortion layer removing step and dividing step and then, the gettering sink effect layer forming step is carried out. The gettering sink effect layer forming step which is carried out after the semiconductor wafer 2 is divided into individual semiconductor chips will be described with reference to FIGS. 11 to 14. The front surface 20a of the substrate 20 of the semiconductor wafer 2 that has been divided into individual semiconductor chips 200 is first put on the front surface of the dicing tape T mounted on the annular frame F, as shown in FIG. 11. Therefore, the rear surface 20b of the substrate 20 of the semiconductor wafer 2 divided into individual semiconductor chips 200 faces up. Then, the gettering sink effect layer forming step is carried out by subjecting each semiconductor chip 200 to a trepanning processing by using the above laser beam processing machine 6 shown in FIG. 5.

The laser beam application means for carrying out the trepanning processing will be described hereinbelow with reference to FIG. 12.

The laser beam application means 62 of the laser beam processing machine 6 shown in FIG. 5 comprises a pulse laser beam oscillation means 81, an output adjustment means 82, a first acousto-optic deflection means 83 for deflecting the optical axis of a laser beam oscillated from the pulse laser beam oscillation means 81 to the processing-feed direction (X direction) and a second acousto-optic deflection means 84 for deflecting the optical axis of a laser beam oscillated from the pulse laser beam oscillation means 81 to the indexing-feed direction (Y direction), all of which are installed in the above casing 621. The above condenser 622 comprise a direction changing mirror 622a for changing the direction of a pulse laser beam passing through the first acousto-optic deflection means 83 and the second acousto-optic deflection means 84 to a downward direction, and a condenser lens 622b for converging the laser beam whose direction has been changed by the direction changing mirror 622a.

The above pulse laser beam oscillation means 81 is constituted by a pulse laser beam oscillator 811 and a repetition frequency setting means 812 connected to the pulse laser beam oscillator 811. The above output adjustment means 82 adjusts the output of a pulse laser beam oscillated from the pulse laser beam oscillation means 81.

The above first acousto-optic deflection means 83 comprises a first acousto-optic device 831 for deflecting the optical axis of a laser beam oscillated from the pulse laser beam oscillation means 81 to the processing-feed direction (X direction), a first RF oscillator 832 for generating RF (radio frequency) to be applied to the first acousto-optic device 831, a first RF amplifier 833 for amplifying the power of RF generated by the first RF oscillator 832 to apply it to the first acousto-optic device 831, a first deflection angle adjustment means 834 for adjusting the frequency of RF generated by the first RF oscillator 832, and a first output adjustment means 835 for adjusting the amplitude of RF generated by the first RF oscillator 832. The above first acousto-optic device 831 can adjust the deflection angle of the optical axis of a laser beam according to the frequency of the applied RF and adjust the output of a laser beam according to the amplitude of the applied RF. The above first deflection angle adjustment means 834 and the above first output adjustment means 835 are controlled by a control means that is not shown.

The above second acousto-optic deflection means 84 comprises a second acousto-optic device 841 for deflecting the optical axis of a laser beam oscillated from the pulse laser beam oscillation means 81 in the indexing-feed direction perpendicular to the processing-feed direction (X direction), a second RF oscillator 842 for generating RF to be applied to the second acousto-optic device 841, a second RF amplifier 843 for amplifying the power of RF generated by the second RF oscillator 842 to apply it to the second acousto-optic device 841, a second deflection angle adjustment means 844 for adjusting the frequency of RF generated by the second RF oscillator 842, and a second output adjustment means 845 for adjusting the amplitude of RF generated by the second RF oscillator 842. The above second acousto-optic device 841 can adjust the deflection angle of the optical axis of a laser beam according to the frequency of the applied RF and adjust the output of a laser beam according to the amplitude of the applied RF. The above second deflection angle adjustment means 844 and the above second output adjustment means 845 are controlled by the control means that is not shown.

Figure 12:
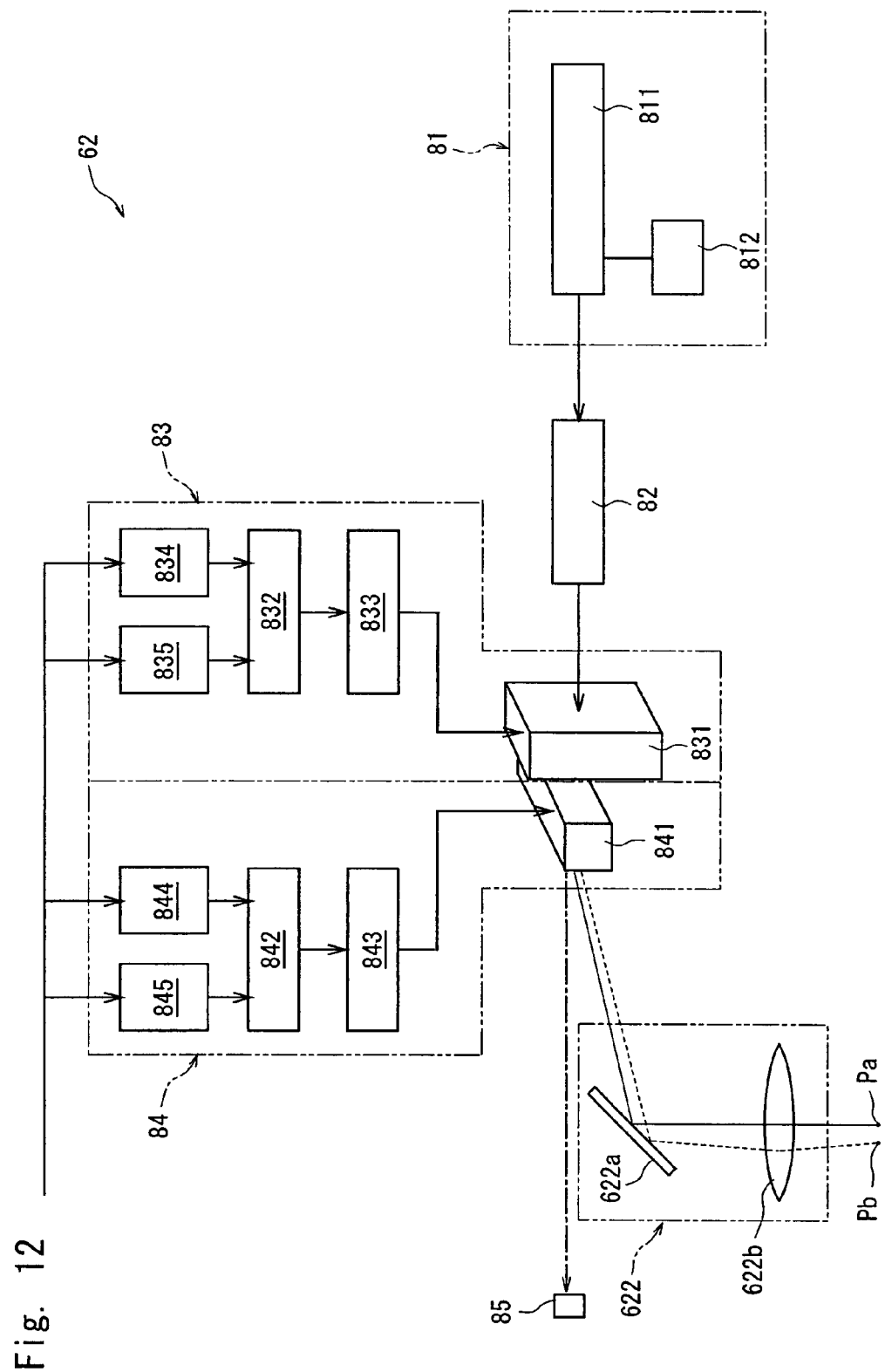
FIG. 12 is a block diagram showing another embodiment of a laser beam application means constituting the laser beam processing machine shown in FIG. 5.

The laser beam application means 62 in the illustrated embodiment comprises a laser beam absorbing means 85 for absorbing a laser beam not deflected by the first acousto-optic device 831 as shown by the dashed dotted line in FIG. 12 when RF is not applied to the above first acousto-optic device 831.

The laser beam application means 62 in the illustrated embodiment is constituted as described above. When RF is not applied to the first acousto-optic device 831 and the second acousto-optic device 841, a pulse laser beam oscillated from the pulse laser beam oscillation means 81 is guided to the laser beam absorbing means 85 through the output adjustment means 82, first acousto-optic device 831 and second acousto-optic device 841, as shown by the dashed dotted line in FIG. 12. When RF having a frequency of, for example, 10 kHz is applied to the first acousto-optic device 831, the optical axis of a pulse laser beam oscillated from the pulse laser beam oscillation means 81 is deflected and focused at a focal point Pa as shown by the solid line in FIG. 12. When RF having a frequency of, for example, 20 kHz is applied to the first acousto-optic device 831, the optical axis of a pulse laser beam oscillated from the pulse laser beam oscillation means 81 is deflected and focused at a focal point Pb which shifts from the above focal point Pa by a predetermined distance in the processing-feed direction (X direction) as shown by the broken line in FIG. 12. When RF having a predetermined frequency is applied to the second acousto-optic device 841, the optical axis of a pulse laser beam oscillated from the pulse laser beam oscillation means 81 is focused at a focal point which shifts from the above focal point Pa by a predetermined distance in the indexing-feed direction (Y direction: perpendicular to the sheet in FIG. 12) perpendicular to the processing-feed direction (X direction).

Figure 13:
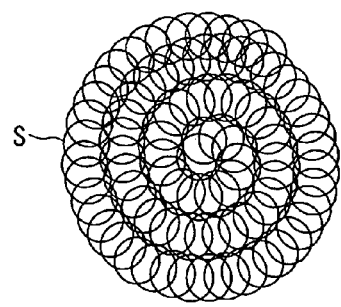
FIG. 13 is an explanatory diagram showing trepanning processing which is carried out by the laser beam application means shown in FIG. 12.

Therefore, trepanning processing for moving the spot S of the pulse laser beam spirally as shown in FIG. 13 can be carried out by activating the first acousto-optic deflection means 83 and the second acousto-optic deflection means 84 to deflect the optical axis of the pulse laser beam in the X direction and Y direction sequentially.

Figure 14:
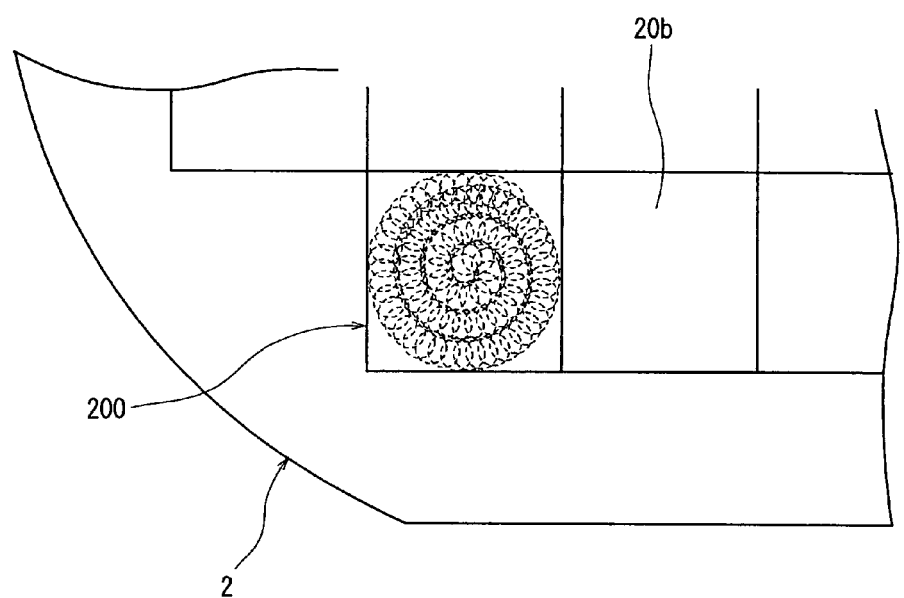
FIG. 14 is an explanatory diagram showing another embodiment of the gettering sink effect layer forming step in the wafer processing method of the present invention.

To carry out the gettering sink effect layer forming step on each semiconductor chip 200 by trepanning using the laser beam processing machine 6 comprising the laser beam application means 62, the semiconductor wafer 2 whose front surface 20a of the substrate 20 is affixed to the front surface of the dicing tape T mounted on the annular frame F as shown in FIG. 11 is held on the above chuck table 61. Then, a predetermined semiconductor chip 200 of the semiconductor wafer 2 held on the chuck table 61 is brought to a position right below the condenser 622 of the laser beam application means 62. Then, the above trepanning processing is carried out as shown in FIG. 14 while a pulse laser beam of a wavelength having permeability for the substrate 20 is applied from the condenser 622 by setting the focal point of the pulse laser beam to the intermediate portion in the thickness direction of the semiconductor wafer 2. As a result, a deteriorated layer which serves as a gettering sink effect layer can be formed in the inside of the semiconductor chip 200.

What is claimed is:

1. A wafer processing method for providing a gettering sink effect to a wafer having a plurality of streets which are formed in a lattice pattern on the front surface of a substrate and devices which are formed in a plurality of areas sectioned by the plurality of streets, comprising:

a grinding distortion layer removing step for removing grinding distortion produced on the rear surface of the substrate of the wafer whose rear surface of the substrate has been ground to a predetermined thickness;

a gettering sink effect layer forming step for forming a gettering sink effect layer by applying a laser beam of a wavelength having permeability for the substrate of the wafer which has undergone the grinding distortion layer removing step, with its focal point set to the inside of the substrate to form a deteriorated layer in the inside of the substrate; and a dividing step for dividing the wafer which has undergone the gettering sink effect layer forming step, into individual chips along the streets.

2. A wafer processing method for providing a gettering sink effect to a wafer having a plurality of streets which are formed in a lattice pattern on the front surface of a substrate and devices which are formed in a plurality of areas sectioned by the plurality of streets, comprising:

a grinding distortion layer removing step for removing grinding distortion produced on the rear surface of the substrate of the wafer whose rear surface of the substrate has been ground to a predetermined thickness;

a dividing step for dividing the wafer which has undergone the grinding distortion layer removing step, into individual chips along the streets; and a gettering sink effect layer forming step for forming a gettering sink effect layer by applying a laser beam of a wavelength having permeability for the substrate of the wafer which has been divided into individual chips by the dividing step, with its focal point set to the inside of the substrate of each chip to form a deteriorated layer in the inside of the substrate.

\* \* \* \* \*